United States Patent
Tsuji et al.

(10) Patent No.: US 11,495,476 B2
(45) Date of Patent: Nov. 8, 2022

(54) SUBSTRATE TREATING APPARATUS

(71) Applicant: SCREEN Holdings Co., Ltd., Kyoto (JP)

(72) Inventors: Tatsuhisa Tsuji, Kyoto (JP); Koji Nishi, Kyoto (JP); Yukihiko Inagaki, Kyoto (JP); Ryuichi Yoshida, Kyoto (JP)

(73) Assignee: SCREEN Holdings Co., Ltd.

( * ) Notice: Subject to any disclaimer, the term of this patent is extended or adjusted under 35 U.S.C. 154(b) by 881 days.

(21) Appl. No.: 16/260,311

(22) Filed: Jan. 29, 2019

(65) Prior Publication Data

US 2019/0279886 A1 Sep. 12, 2019

(30) Foreign Application Priority Data

Mar. 6, 2018 (JP) .............................. JP2018-039542

(51) Int. Cl.
*H05B 3/68* (2006.01)
*H01L 21/67* (2006.01)
(Continued)

(52) U.S. Cl.
CPC .. *H01L 21/67103* (2013.01); *H01L 21/67109* (2013.01); *H01L 21/67739* (2013.01); *H01L 21/67748* (2013.01); *H01L 21/68742* (2013.01)

(58) Field of Classification Search
CPC ......... H01L 21/67103; H01L 21/67109; H01L 21/677; H01L 21/67703; H01L 21/67739;
(Continued)

(56) References Cited

U.S. PATENT DOCUMENTS 6,538,872 B1 * 3/2003 Wang ................. H01L 21/6833
361/103
6,599,366 B1 7/2003 Kitano et al. ................. 118/666
(Continued)

FOREIGN PATENT DOCUMENTS

JP H06-260408 A 9/1994
JP H07-050273 A 2/1995
(Continued)

OTHER PUBLICATIONS

Notice of Allowance dated Sep. 9, 2021 for corresponding Taiwanese Patent Application No. 108103041.
(Continued)

*Primary Examiner* — Sang Y Paik
(74) *Attorney, Agent, or Firm* — Ostrolenk Faber LLP (57) ABSTRACT

Disclosed is a substrate treating apparatus that performs a heat treatment to a substrate. The apparatus includes the following elements: a heat treating plate; a casing that produces a heat treatment atmosphere by the heat treating plate; a movable top board that is movable between a ceiling surface of the casing and the heat treating plate; and a controller that causes the movable top board to be moved to a raised position when the substrate is loaded/unloaded, and causes the movable top board to be moved to a lowered position when the substrate is placed on the heat treating plate for performing the heat treatment, thereby controlling the lowered position for every substrate.

6 Claims, 5 Drawing Sheets

(51) Int. Cl.
*H01L 21/687* (2006.01)
*H01L 21/677* (2006.01)

(58) Field of Classification Search
CPC ......... H01L 21/67748; H01L 21/67763; H01L 21/67778; H01L 21/687; H01L 21/68714; H01L 21/68742; H01L 21/6875
USPC ...................................... 219/444.1
See application file for complete search history.

(56) References Cited

U.S. PATENT DOCUMENTS

| | | | |
|---|---|---|---|
| 6,639,189 B2 * | 10/2003 | Ramanan | H01L 21/67103 219/390 |
| 6,824,616 B2 * | 11/2004 | Kitano | H01L 21/6715 118/666 |
| 2002/0177094 A1 | 11/2002 | Shirakawa | 432/4 |
| 2003/0010446 A1 * | 1/2003 | Kajiyama | C23C 16/4404 156/345.1 |
| 2003/0054668 A1 | 3/2003 | Kitano et al. | 438/782 |
| 2004/0060513 A1 | 4/2004 | Kojima et al. | 118/715 |
| 2007/0218706 A1 * | 9/2007 | Matsuoka | H01L 21/67178 438/781 |
| 2009/0158613 A1 | 6/2009 | Aihara | 34/341 |
| 2015/0371894 A1 | 12/2015 | Kaneda et al. | |
| 2016/0214148 A1 | 7/2016 | Okutani et al. | |
| 2016/0273836 A1 | 9/2016 | Obara et al. | |
| 2016/0281235 A1 * | 9/2016 | Fukumoto | H01L 21/6715 |

FOREIGN PATENT DOCUMENTS

| | | |
|---|---|---|
| JP | H11-054393 A | 2/1999 |
| JP | 2000-003843 A | 1/2000 |
| JP | 2002-184846 A | 6/2002 |
| JP | 2003-124102 A | 4/2003 |
| JP | 2003-168643 A | 6/2003 |
| JP | 2006-019472 A | 1/2006 |
| JP | 2006-274316 A | 10/2006 |
| JP | 2007-242850 A | 9/2007 |
| KR | 2001-0051688 A | 6/2001 |
| KR | 10-2003-0025199 A | 3/2003 |
| KR | 10-0583134 B1 | 5/2006 |
| KR | 10-0692496 B1 | 3/2007 |
| TW | 200845179 A | 11/2008 |
| TW | 200937562 A | 9/2009 |
| TW | 201306157 A | 2/2013 |
| TW | 201308419 A | 2/2013 |
| TW | 201611908 A | 4/2016 |
| TW | 201703209 A | 1/2017 |
| TW | 201705356 A | 2/2017 |

OTHER PUBLICATIONS

Office Action dated May 4, 2020 for corresponding Korean Patent Application No. 10-2019-0011209.
Office Action dated Sep. 24, 2020 for corresponding Korean Patent Application No. 10-2019-0011209.
Office Action dated Nov. 27, 2019 for corresponding Republic of China Patent Application No. 108103041.
Office Action dated Dec. 14, 2021 for corresponding Japanese Patent Application No. 2018-039542.

* cited by examiner

SUBSTRATE TREATING APPARATUS

BACKGROUND OF THE INVENTION

1. Field of the Invention

The present invention relates to a substrate treating apparatus that performs a heat treatment to various types of substrates such as a semiconductor wafer, a substrate for liquid crystal display, a substrate for plasma display, a substrate for organic EL, a substrate for field emission display (FED), a substrate for optical display, a magnetic disk substrate, an optical magnetic disk substrate, a substrate for a photomask, and a solar cell substrate (hereinafter, simply referred to as a substrate.)

2. Description of the Related Art

Examples of the currently-used apparatus of this type include one having a heat treating plate, a cover member, a casing, a top board, and a positioning member. The heat treating plate heats a substrate placed thereon. The cover member is configured to cover the above of the heat treating plate, to be liftable relative to the heat treating plate, and to produce a heat treatment atmosphere by the heat treating plate. The casing covers the heat treating plate and the cover member. The top board is arranged between the ceiling surface of the cover member and a top face of the heat treating plate. The positioning member adjusts a gap between a lower face of the top board and the top face of the heat treating plate. See, for example, Japanese Unexamined Patent Publication No. 2000-3843A.

In the substrate treating apparatus configured in such a manner as above, the positioning member adjusts the gap between the substrate and the top board in a predetermined state for performing a heat treatment to the substrate. This yields an enhanced in-plane uniformity in temperature distribution of the substrate, leading to an in-plane uniformity of the substrate during the treatment.

However, the conventional example with such a configuration as above possesses the following drawback. That is, the positioning member of the currently-used apparatus adjusts the gap between the substrate and the top board in advance. Accordingly, it becomes difficult to perform control to every substrate about the in-plane uniformity in temperature distribution of the substrate. Such a drawback may arise.

Specifically, in the conventional example, the positioning member formed by a bolt and a nut fixes a level of the top board relative to the heat treating plate. Consequently, during treatment of one substrate, a gap between the substrate and the top board is narrowed for making it relatively difficult to escape heat of the substrate. Alternatively, during treatment of another substrate, a gap between the other substrate and the top board is widened for making it relatively easy to escape heat of the substrate. In this manner, positive control is not performable to a soaking performance representing the in-plane uniformity in temperature distribution of the substrate.

SUMMARY OF THE INVENTION

The present invention has been made regarding the state of the art noted above, and its one object is to provide a substrate treating apparatus that allows control of a soaking performance of a substrate with a devised top board.

The present invention is constituted as stated below to achieve the above object.

One aspect of the present invention provides a substrate treating apparatus that performs a heat treatment to a substrate. The apparatus includes: a heat treating plate that heats the substrate placed thereon; a casing that covers above the heat treating plate to produce a heat treatment atmosphere by the heat treating plate; a movable top board that is movable between a ceiling surface of the casing and the heat treating plate; and a controller that causes the movable top board to be moved to a raised position adjacent to the ceiling surface of the casing when the substrate is loaded/unloaded to/from the heat treating plate, and causes the movable top board to be moved to a lowered position lower than the raised position and spaced away from the substrate on the heat treating plate by a given level when the substrate is placed on the heat treating plate for the heat treatment, thereby controlling the lowered position for every substrate.

According to the aspect of the present invention, the controller that causes the movable top board to be moved to the raised position when the is loaded/unloaded to/from the heat treating plate, and causes the movable top board to be moved to the lowered position when the substrate is placed on the heat treating plate for performing the heat treatment, thereby controlling the lowered position for every substrate. Accordingly, different levels of the lowered position for every substrate achieves control to every substrate about the in-plane uniformity in temperature distribution of the substrate. In addition, if the movable top board is moved to the lowered position, the movable top board is moved upwardly to the raised position upon loading/unloading of the substrate. This achieves smooth loading/unloading of the substrate with no interference with the movable top board during the loading/unloading of the substrate.

Moreover, it is preferred in the aspect of the present invention that the movable top board includes a circular opening formed at a center portion thereof in plan view with its diameter smaller than a diameter of the substrate.

Although temperatures are reduced more easily at a peripheral edge than at the center portion of the substrate, radiation from the movable top board allows suppressed temperature reduction at the peripheral edge of the substrate. Moreover, in recent years, an underlayer film called a coating carbon film is occasionally formed for microfabrication process. In order to form the underlayer film, the heat treatment at high temperatures is performed to the substrate. During the treatment, gas containing sublimate is produced. The gas is capable of being exhausted smoothly through the opening of the movable top board, yielding suppressed adhesion of the sublimate to the movable top board. As a result, the substrate is capable of being prevented from contamination due to dropped sublimate from the movable top board.

It is preferred in the aspect of the present invention that the movable top board has a diameter in plan view smaller than a diameter of the substrate.

Since the temperature of the center portion of the substrate is more unlikely to be lowered, a heat treatment is performable while a difference in treatment between the center portion and the peripheral edge of the substrate is made large intentionally.

It is preferred in the aspect of the present invention that a lift movable top board that causes the movable top board to move upwardly/downwardly is further included, and that the lifting mechanism is disposed below the heat treating plate so as to be thermally separated from the heat treating plate.

Recently, in particular, an underlayer film called a coating carbon film is occasionally formed for microfabrication process. In order to form the underlayer film, a heat treatment at higher temperatures of 300 to 500° C. is performed relative to the currently-performed heat treatment at temperatures of 100 to 150° C. At such high temperatures, the lifting mechanism may suffer breakdown by a heat influence. Accordingly, the lifting mechanism is disposed below the heat treating plate to be separated thermally, leading to avoidance of such an inconvenience as above to enhance availability.

Moreover, it is preferred that the heat treating plate is circular in plan view, the movable top board is rectangular in plan view with its diagonal length larger than a diameter of the heat treating plate, and the lifting mechanism is connected to four corners of the movable top board.

Since heat of the heat treating plate is unlikely to be transmitted to the four corners of the movable top board, the heat is unlikely to be transmitted to the lifting mechanism. Consequently, the lifting mechanism is unlikely to suffer influence of the heat, leading to suppression in failure.

It is preferred in the aspect of the present invention that the movable top board is formed by ceramic or an alloy of metal and ceramic.

The movable top board formed by ceramic or an alloy of metal and ceramic avoids deformation by the heat even under the heat treatment at high temperatures for production of the underlayer film.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

The following describes one embodiment of the present invention with reference to drawings.

Figure 1:
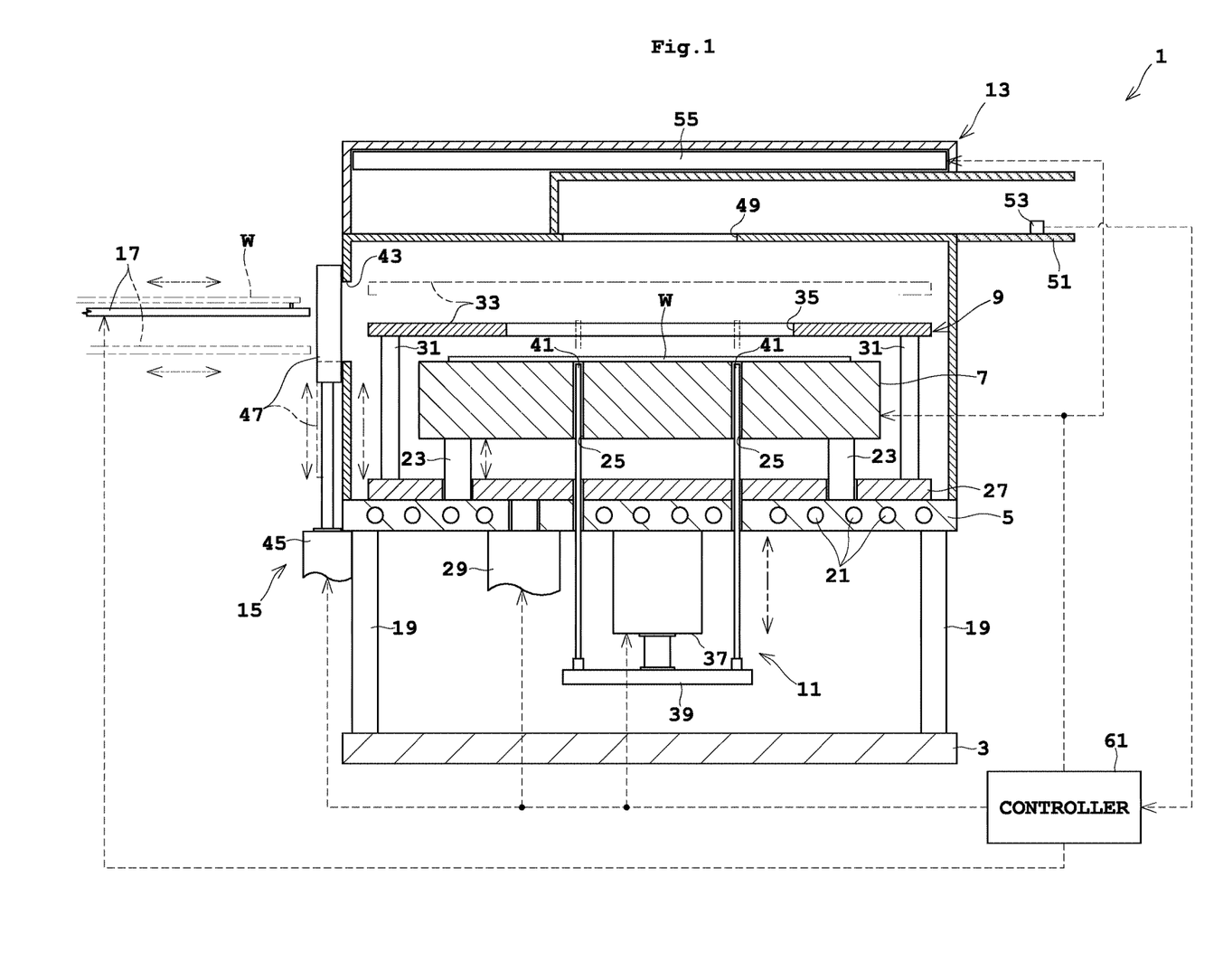
FIG. 1 schematically illustrates an entire configuration of a substrate treating apparatus according to one embodiment of the present invention.
Figure 2:
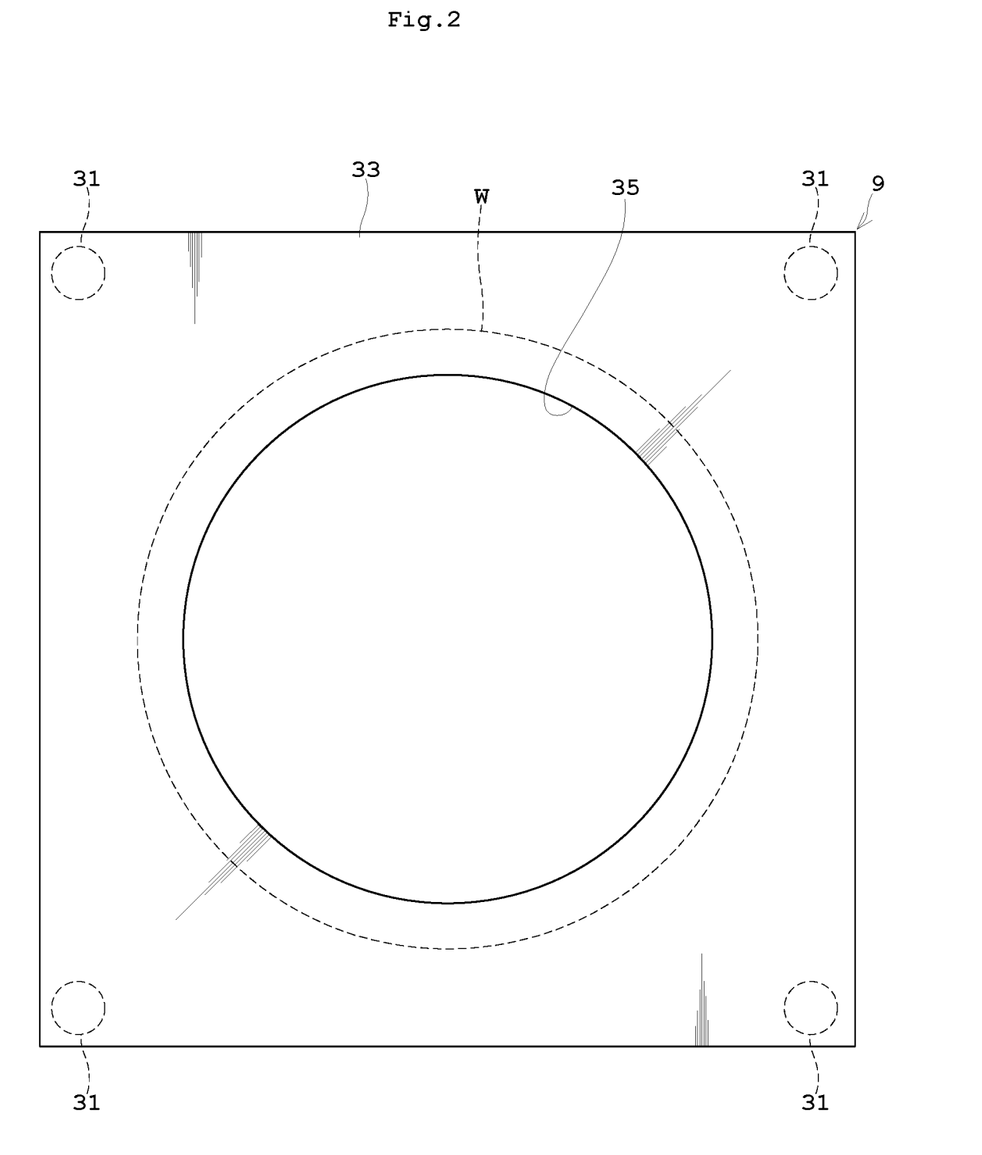
FIG. 2 is a plan view of a movable top board.
Figure 3:
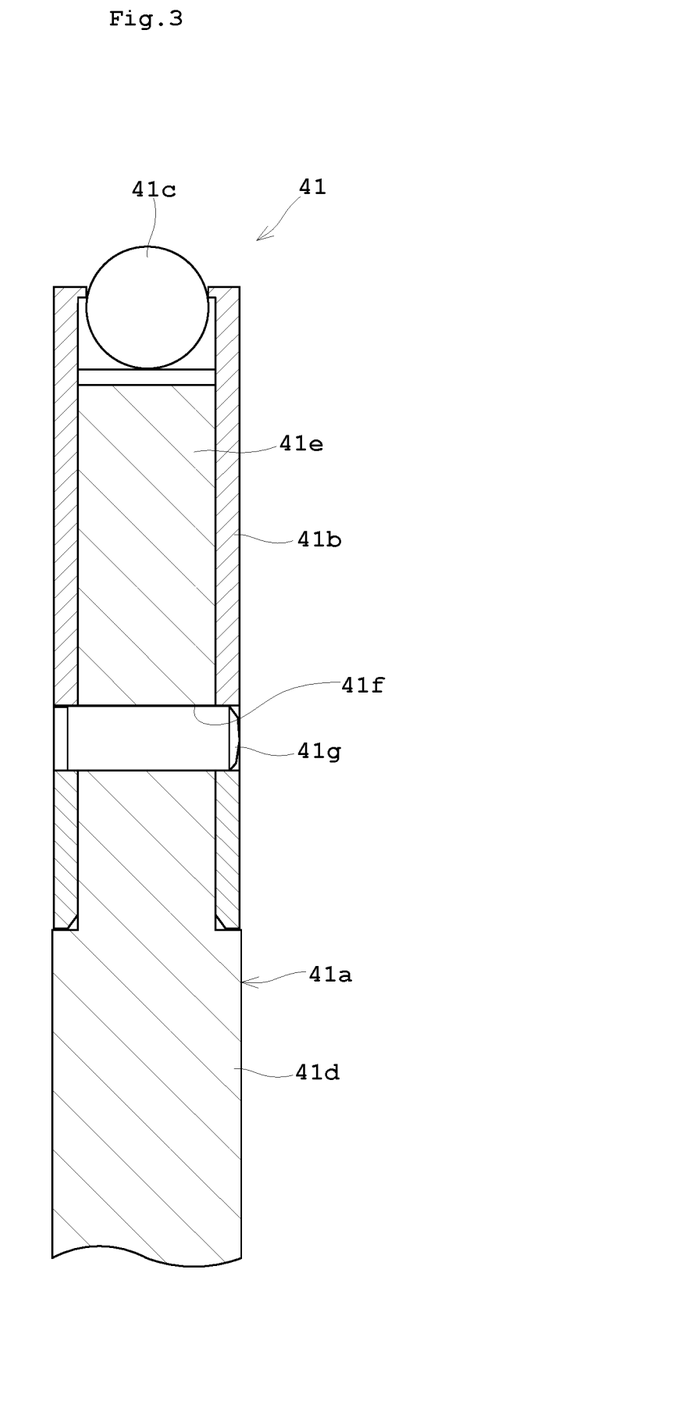
FIG. 3 is a longitudinal sectional view around a tip portion of a lift pin.

FIG. 1 schematically illustrates an entire configuration of a substrate treating apparatus according to one embodiment of the present invention. FIG. 2 is a plan view of a movable top board. FIG. 3 is a longitudinal sectional view around a tip portion of a lift pin.

A substrate treating apparatus 1 according to this embodiment performs a heat treatment to a substrate W. Specifically, a heat treatment is performed when an underlayer film called a coating carbon film is formed for microfabrication process. In order to form the underlayer film, the heat treatment at high temperatures of 300 to 500° C. is performed.

The substrate treating apparatus 1 includes a lower base plate 3, a water-cooling base plate 5, a heat treating plate 7, a movable top board 9, a lift pin unit 11, a casing 13, and a shutter unit 15.

The substrate treating apparatus 1 loads the substrate W by a transfer arm 17 disposed adjacent thereto, performs the heat treatment to the substrate W, and thereafter unloads the treated substrate W by the transfer arm 17.

Struts 19 erect on a top face of the lower base plate 3. The water-cooling base plate 5 is disposed on the struts 19. The water-cooling base plate 5 suppresses downward transmission of heat from the heat treating plate 7. Specifically, the water-cooling base plate 5 includes a refrigerant channel 21 formed inside thereof entirely, for example, for allowing a refrigerant to flow. Examples of the refrigerant that flows in the refrigerant channel 21 include cooling water. The cooling water has a controlled temperature of 20° C., for example.

The heat treating plate 7 is circular in plan view. The heat treating plate 7 has a diameter slightly larger than a diameter of the substrate W. The heat treating plate 7 includes a heating device, such as a heater not shown, embedded therein, and is heated such that a surface temperature thereof reaches 400° C., for example. The heat treating plate 7 is spaced away upwardly from the water-cooling base plate 5 via struts 23 that are disposed between a lower face of the heat treating plate 7 and a top face of the water-cooling base plate 5. The heat treating plate 7 includes four through holes 25 formed therein. The through holes 25 are disposed at positions, respectively, that correspond to vertices of an equilateral triangle in plan view.

The heat treating plate 7 has a movable top board unit 9 attached thereto. The movable top board unit 9 includes a lifting base plate 27, a lifting mechanism 29, struts 31, and a movable top board 33.

The lifting base plate 27 includes openings for avoiding interference with the struts 23 and lift pins 41 mentioned later. The lifting mechanism 29 is formed by an air cylinder, for example. The lifting mechanism 29 is tightly attached to the water-cooling base plate 5 in such a state that a part thereof with an operating shaft is directed upwardly. The lifting mechanism 29 is fixable at a position where a tip portion of the operating shaft thereof is arranged in any level. The operating shaft of the lifting mechanism 29 is connected to a bottom face of the lifting base plate 27. The operating shaft of the lifting mechanism 29 moves upwardly/downwardly, thereby allowing variation in level of the lifting base plate 27. For instance, four struts 31 erect on the top face of the lifting base plate 27. The movable top board 33 is attached to upper ends of the four struts 31.

As illustrated in FIG. 2, the movable top board 33 includes an opening 35 at a center portion thereof in plan view. The opening 35 has a diameter smaller than that of the substrate W in plan view. The lifting mechanism 29 operates, whereby the movable top board 33 moves upwardly/downwardly along with the lifting base plate 27. The movable top board 33 moves upwardly/downwardly between a lowered position where the heat treatment is performed to the substrate W and a raised position where the substrate W is loaded. Here, it is preferred that the lowered position has a gap of approximately 10 mm between the top face of the substrate W and the lower face of the movable top board 33. This is because experiments by Inventors reveal that this gap is suitable for enhancing in-plane uniformity of a temperature distribution on the surface of the substrate W.

The movable top board 33 is rectangular with its diagonal length longer than the diameter of the heat treating plate 7. The four struts 31 have upper ends connected to four corners of the lower face of the movable top board 33, respectively. The four corners of the movable top board 33 are far from the heat treating plate 7 as a heat source that is circular in plan view. Accordingly, if the movable top board 33 is heated due to radiant heat of the heat treating plate 7, the struts 31 are formable so as for the heat not to be transmitted thereto with ease. Consequently, the lifting mechanism 29 is unlikely to suffer influence of the heat, leading to suppression in failure.

It is preferred that the movable top board 33 mentioned above is formed by ceramic or an alloy of metal and ceramic. This avoids deformation by the heat even under the heat treatment at high temperatures.

The lift pin unit 11 includes a drive mechanism 37, a lifting ring 39, and three lift pins 41. Here, only two lift pins 41 are illustrated for an illustrative reason.

The drive mechanism 37 is formed by an air cylinder, for example. The drive mechanism 37 is tightly attached to the lower face of the water-cooling base plate 5 in such a state that a part thereof with an operating shaft is directed downwardly. The lower part of the operating shaft is connected to the lifting ring 39. The lifting ring 39 has a top face where three lift pins 41 erect. The drive mechanism 39 is capable of adjusting levels of the operating shaft of between two positions, i.e., a deliver position (illustrated by chain double-dashed lines in FIG. 1) and a treatment position (illustrated by solid lines in FIG. 1). In the deliver position, the three lift pins 41 protrude upwardly from the top face of the heat treating plate 7. In the treatment position, the three lift pins 41 are sunk downwardly from the top face of the heat treating plate 7. The three lift pins 41 are inserted into three through holes 25 formed in the heat treating plate 7.

It is preferred that the lift pins 41 are each configured in such a manner as illustrated in FIG. 3. The lift pins 41 each include a core part 41a, an outer cylinder 41b, and a quartz ball 41c. The core part 41a includes a tip portion 41e that corresponds to an upper part of a barrel 41d. The tip portion 41e has a diameter smaller than the barrel 41d. The outer cylinder 41b has an internal diameter slightly larger than an external diameter of the quartz ball 41 at portions other than the tip portion. The tip portion of the outer cylinder 41b has an internal diameter slightly larger than a diameter of the quartz ball 41c. The diameter of the quartz ball 41c is slightly smaller than that of the tip portion 41e. Accordingly, when the outer cylinder 41b covers the quartz ball 41c while the quartz ball 41c is disposed on a top face of the tip portion 41e, the quartz ball 41 protrudes from the outer cylinder 41b by a length of an approximately one-third diameter thereof. Under such a condition, an engagement pin 41g presses into a through hole 41f through which the core part 41d and the outer cylinder 41b pass, whereby the outer cylinder 41b is fixed on the core part 41a together with the quartz ball 41c to form the lift pin 41. Here, members other than the quartz ball 41c are metal.

Although quartz is a suitable material capable of resisting high temperature environment, it is difficult to make the lift pins 41 entirely from quartz. Then, only the quartz ball 41c at the tip portion is made from quartz as mentioned above, whereby suppressed costs are obtainable. Moreover, quartz has hardness slightly lower than a single-crystal silicon used as a material of the substrate W. This leads to low possibility of damages on the lower face of the substrate W. In addition, this achieves a minimized contact area since the quartz ball is spherical.

The casing 13 covers above the heat treating plate 7 to form the heat treatment atmosphere by the heat treating plate 7. The casing 13 has one face where a load/unload opening 43 is formed. The load/unload opening 43 opens at a position higher than that near the top face of the heat treating plate 7. The transfer arm 17 loads/unloads the substrate W through the load/unload opening 43.

The load/unload opening 43 has a shutter unit 15 attached thereto. The shutter unit 15 includes a drive mechanism 45, and a shutter body 47. The drive mechanism 45 is tightly attached to the water-cooling base plate 5 partially in such a state that a part thereof with an operating shaft is directed upwardly. The upper part of the operating shaft is connected to the shutter body 47. When the drive mechanism 45 extends the operating shaft, the shutter body 47 moves upwardly to close the load/unload opening 43 (illustrated by solid lines in FIG. 1). When the drive mechanism 45 retracts the operating shaft, the shutter body 47 moves downwardly to open the load/unload opening 43 (illustrated by chain double-dashed lines in FIG. 1).

The casing 13 has the ceiling surface where an exhaust port 49 is formed. The exhaust port 49 is in communication with an exhaust pipe 51. The exhaust port 49 of the casing 13 is spaced away from the top face of the heat treating plate 7 by a gap of approximately 30 mm, for example. The exhaust pipe 51 is in communication with an exhaust set-up not shown. A pressure sensor 53 is disposed on a part of the exhaust pipe 51. The pressure sensor 53 detects exhaust pressure within the exhaust pipe 51.

The casing 13 includes a sheathed heater 55 disposed along the top face of the exhaust pipe 51. The sheathed heater 55 heats the casing 13 and the exhaust pipe 51, and prevents adhesion of sublimate to an inner wall of the casing 13 when gas containing the sublimate contacts the casing 13 to be cooled.

A controller 61 is formed by a CPU and a memory not shown. The controller 61 performs the following control as under: temperature control of the heat treating plate 7, lifting control of the movable top board unit 9, drive control of the lift pin unit 11, open/close control of the shutter unit 15, temperature control of the sheathed heater 55, and exhaust control based on the pressure sensor 53. Moreover, the controller 61 is capable of operating the lowered position during the lift control of the movable top board unit 9 in various manners depending on the substrate W. For instance, recipes that specify a treatment condition or a procedure for every substrate W are prepared to include one to define the lowered position of the movable top board 33. Then, an instruction unit, not shown, operates to provide to the recipes a parameter that corresponds to a gap between the movable top board 33 and a surface of the substrate W. When the substrate W is treated, for example, the controller 61 refers to the recipe depending on the substrate W under the instruction by a device operator, and operates the lifting mechanism 29 in accordance with the parameter. This yields adjustment of the lowered position of the movable top board 33 for every substrate W.

Figure 4:
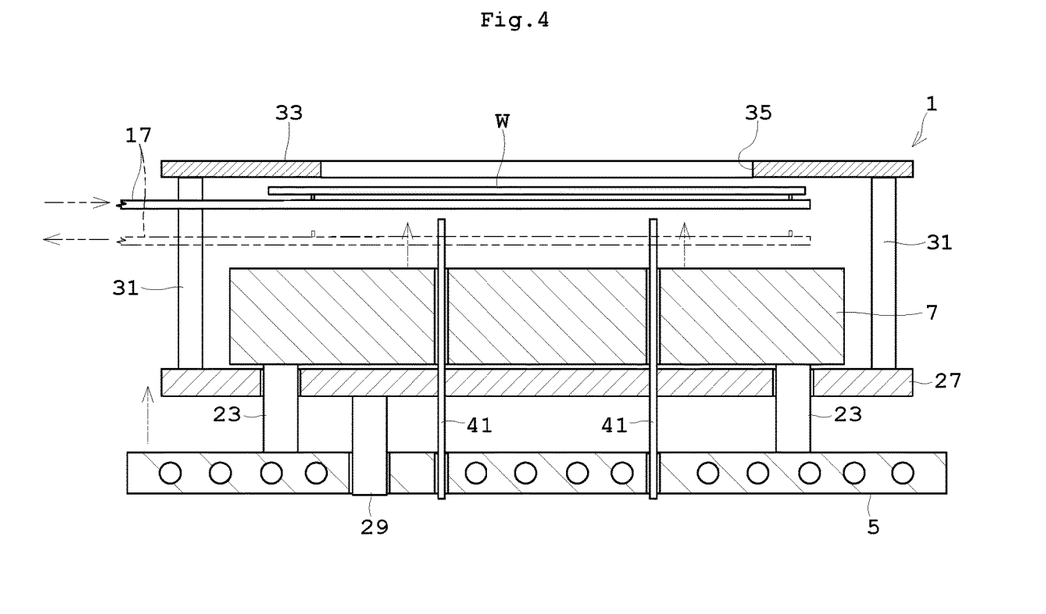
FIG. 4 is a longitudinal sectional view of loading/unloading a substrate.
Figure 5:
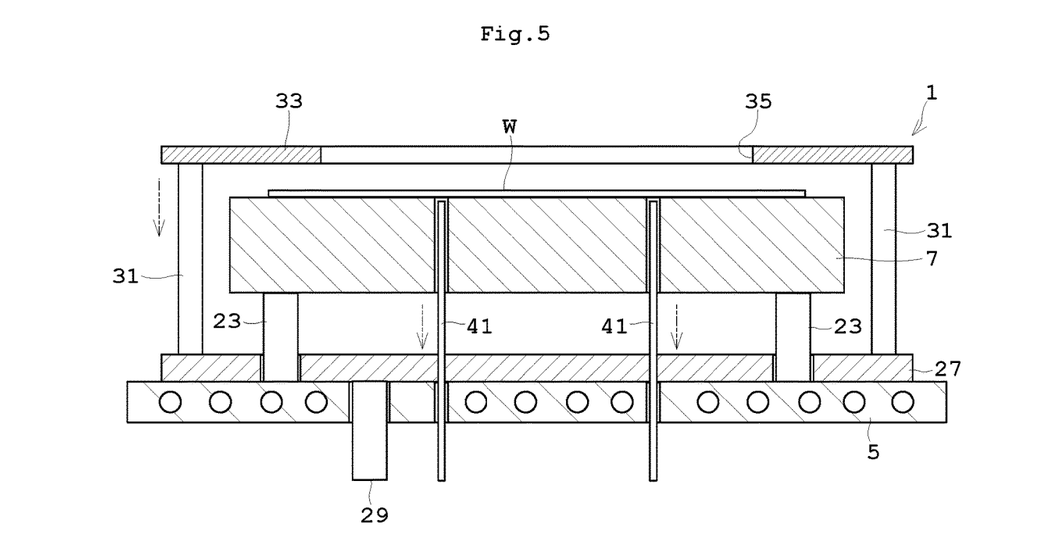
FIG. 5 is a longitudinal sectional view of heating the substrate.

Next, the following describes treatment of the substrate W by the substrate treating apparatus having the above-described configuration with reference to FIGS. 4 and 5. FIG. 4 is a longitudinal sectional view of loading/unloading the substrate. FIG. 5 is a longitudinal sectional view of heating the substrate.

Firstly, as illustrated in FIG. 4, the controller 61 operates the movable top board unit 9 to move the movable top board 33 to the raised position. In addition, the controller 61 operates the lift pin unit 11 to move the three lift pins 41 to the deliver position. Along with such operation, the controller 61 operates the shutter unit 15 to open the load/unload opening 43.

Then, the controller 61 causes the transfer arm 17 to enter through the load/unload opening 43 while the transfer arm 17 is disposed at a position higher than the deliver position and lower than the lower face of the movable top board in the raised position, and to move downwardly above the heat treating plate 7. This causes the substrate W to be delivered to the lift pins 41 in the deliver position. Thereafter, the transfer arm 17 is caused to move backwardly through the load/unload opening 43, and the shutter unit 15 is operated to close the load/unload opening 43.

Thereafter, as illustrated in FIG. 5, the controller 61 operates the lift pin unit 11 to move the three lift pins 41 to the treatment position. Accordingly, a heat treatment is performed to the substrate W at 400° C. The controller 61 refers to the recipe to perform the heat treatment for a defined heating time.

After a given heating time elapses, the controller 61 operates the movable top board unit 9 and the lift pin unit 11 to move the movable top board 33 upwardly to the raised position and to move the lift pin 41 upwardly to the deliver position, respectively. Then, the controller 61 operates the shutter unit 15 to open the load/unload opening 43. Moreover, the controller 61 causes the transfer arm 17 to enter through the load/unload opening 43 at a position below the deliver position and above the top face of the heat treating plate 7. Then, the transfer arm 17 is caused to move upwardly to the position higher than the deliver position and lower than the lower face of the movable top board 33, thereby receiving the treated substrate W from the lift pins 41. Thereafter, the transfer arm 17 is caused to move backwardly through the load/unload opening 43, thereby unloading the treated substrate W.

The heat treatment to one substrate W is completed by a series of operation mentioned above. When another new substrate W is to be treated, the controller 61 is capable of referring to the recipe under the instruction by the device operator to adopt the raised position of the movable top board 33 by the movable top board unit 9 as the recipe.

According to the aspect of the present invention, the controller 61 that causes the movable top board 33 to be moved to the raised position when the substrate W is loaded/unloaded to/from the heat treating plate 7, and causes the movable top board 33 to the lowered position when the substrate W is placed on the heat treating plate 7 for performing the heat treatment to the substrate W, thereby controlling the lowered position for every substrate W. Accordingly, different levels of the lowered position for every substrate W achieves control to every substrate about the in-plane uniformity in temperature distribution of the substrate W. In addition, if the movable top board 33 is moved to the lowered position, the movable top board 33 is moved upwardly to the raised position upon loading/unloading of the substrate W. This achieves smooth loading/unloading of the substrate W with no interference between the transfer arm 17 and the movable top board 33 during the loading/unloading of the substrate W.

Moreover, the movable top board 33 having the circular opening 35 with its diameter smaller than the diameter of the substrate W being formed at the center portion thereof produces the following effects.

Although temperatures are reduced more easily at the peripheral edge than at the center portion of the substrate W, radiation from the movable top board 33 allows suppressed temperature reduction at the peripheral edge of the substrate W. Moreover, when an underlayer film called a coating carbon film is formed, gas containing sublimate is produced. The gas is capable of being exhausted smoothly through the opening 35 of the movable top board 33, yielding suppressed adhesion of the sublimate to the movable top board 33. As a result, the substrate is capable of being prevented from contamination due to dropped sublimate from the movable top board 33. Furthermore, since the number of maintenance for removing the sublimate adhering to the movable top board 33, enhanced availability of the substrate treating apparatus 1 is performable.

Moreover, the lifting mechanism 29 of the movable top board unit 9 is tightly attached to the water-cooling base plate 5. This achieves prevention of suffering a breakdown in the lifting mechanism 29 due to heat influences caused by high temperatures (300 to 500° C.) from the heat treating plate 7. Consequently, enhanced availability of the substrate treating apparatus 1 is performable.

<Modification>

Figure 6:
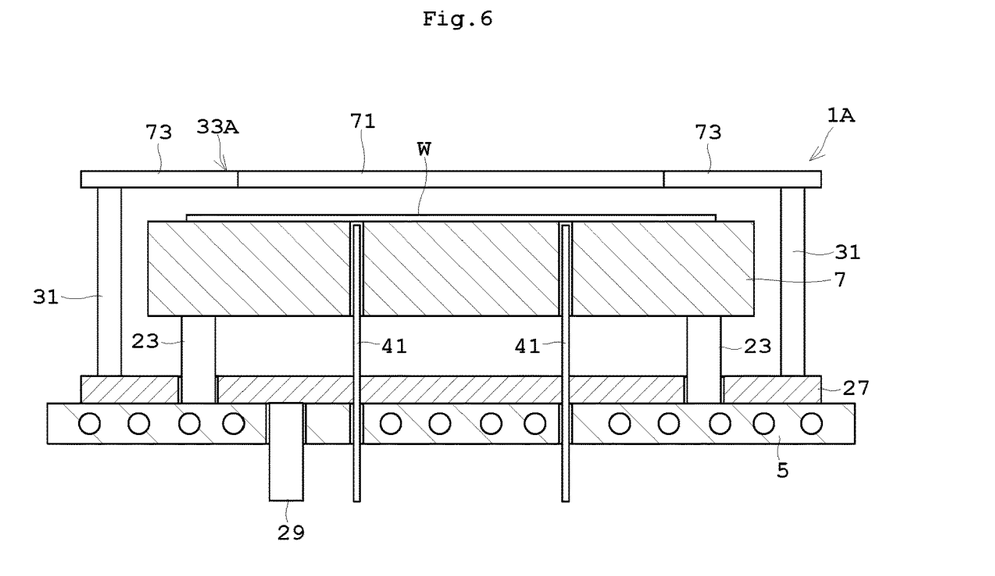
FIG. 6 is a longitudinal sectional view of a movable top board according to one modification.
Figure 7:
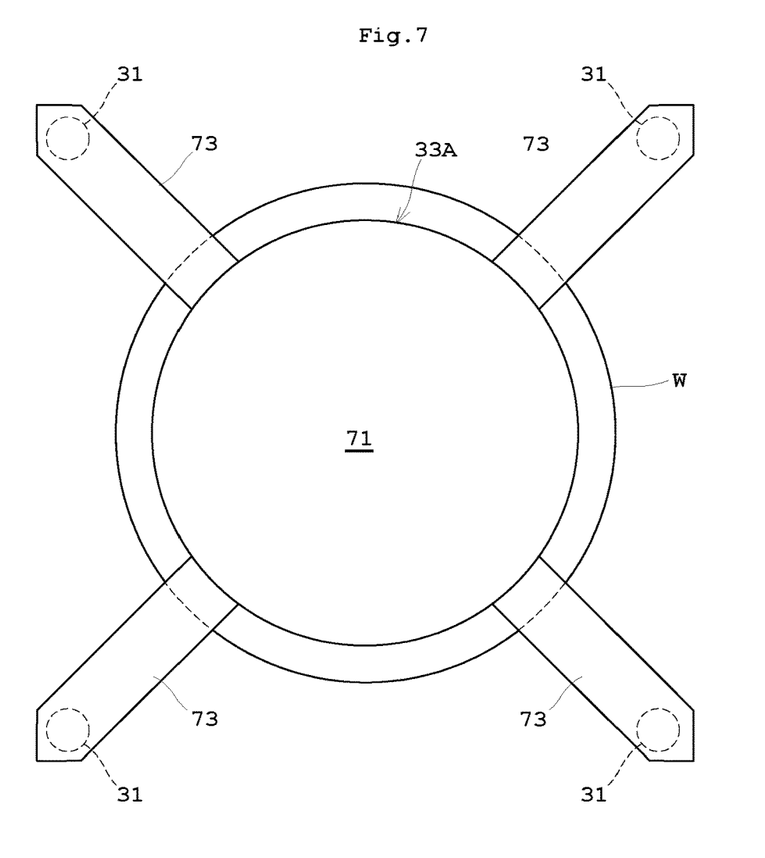
FIG. 7 is a plan view of a movable top board according to the modification.

Instead of the substrate treating apparatus 1 described above, such a configuration of a substrate treating apparatus 1A is adoptable. Reference is now made to FIGS. 6 and 7. FIG. 6 is a longitudinal sectional view of a movable top board according to one modification. FIG. 7 is a plan view of a movable top board according to the modification.

The substrate treating system 1A differs from the substrate treating apparatus 1 described above in configuration of the movable top board 33. Specifically, the movable top board 33A includes a top board part 71 and supporting parts 73.

The top board part 71 is formed to have a diameter smaller than the diameter of the substrate W in plan view. The supporting parts 73 protrude from a peripheral edge of the top board part 71 in four directions. The supporting parts 73 has ends connected to the struts 31, respectively.

With such substrate treating apparatus 1A, since the temperature of the center portion of the substrate W is more unlikely to be lowered, a heat treatment is performable while a difference in treatment between the center portion and the peripheral edge of the substrate W is made large intentionally.

The present invention is not limited to the foregoing examples, but may be modified as follows.

(1) In the embodiments described above, the movable top board 33 includes the opening 35, and the movable top board 33A has the diameter smaller than the diameter of the substrate W. However, the present invention is not limitative to this configuration. For instance, instead of these movable top boards 33, 33A, a movable top board 33B like a punching board is applicable having a plurality of through holes formed therein uniformly.

(2) In the embodiments described above, the lifting mechanism 29 of the movable top board unit 9, the drive mechanism 37 of the lift pin unit 11, and the drive mechanism 45 of the shutter unit 15 are tightly attached to the water-cooling base plate 5. However, such arrangement is not limitative in the present invention. For instance, the components described above may be spaced away downwardly from the water-cooling base plate 5 so as not to suffer influences of high temperatures from the heat treating plate 7.

(3) In the embodiments described above, the movable top board 33 is a planar plate with the opening 35. However, the present invention is not limitative to this configuration. For instance, the movable top board 33 may be a three-dimensional cone shape that a level thereof gradually increases from the peripheral edge of the substrate W toward the center of the opening 35. This allows effective introduction to the exhaust port 49 of gas containing the sublimate generated from the substrate W.

(4) In the embodiments described above, the lifting mechanism 29 is formed by the air cylinder. However, the present invention is not limitative to this configuration. Moreover, instead of the air cylinder, a motor is adoptable as the lifting mechanism 29. Note that this is similarly applicable to the drive mechanisms 37, 45.

(5) In the embodiments described above, the movable top board 33 is formed by ceramic or an alloy of metal and ceramic. However, the material of the movable top board 33 is not limitative to these.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus that performs a heat treatment to a substrate, the apparatus comprising:
    a heat treating plate that heats the substrate placed thereon;
    a casing that covers above the heat treating plate to produce a heat treatment atmosphere by the heat treating plate;
    a movable top board that is movable between a ceiling surface of the casing and the heat treating plate; and
    a controller that causes the movable top board to be moved to a raised position adjacent to the ceiling surface of the casing when the substrate is loaded/unloaded to/from the heat treating plate, and causes the movable top board to be moved to a lowered position lower than the raised position and spaced away from the substrate on the heat treating plate by a given level when the substrate is placed on the heat treating plate for the heat treatment, thereby controlling the lowered position for every substrate,
    the substrate treating apparatus further comprising a lifting mechanism that is caused by the controller to move the movable top board upwardly/downwardly, wherein
    the lifting mechanism is disposed below the heat treating plate via a water-cooling base plate so as to be thermally separated from the heat treating plate,
    the movable top board includes a top board part and a supporting part that supports a peripheral edge of the top board part, and
    the top board part is formed to have a diameter smaller than a diameter of the substrate in plan view.

2. The substrate treating apparatus according to claim 1, wherein
    the movable top board includes a circular opening formed at a center portion thereof in plan view with its diameter smaller than a diameter of the substrate.

3. The substrate treating apparatus according to claim 2, wherein
    the movable top board is formed by ceramic or an alloy of metal and ceramic.

4. The substrate treating apparatus according to claim 2, wherein
    the controller determines as the lowered position a position where a gap between a top face of the substrate and a lower face of the movable top board is 10 mm.

5. The substrate treating apparatus according to claim 1, wherein
    the movable top board is formed by ceramic or an alloy of metal and ceramic.

6. The substrate treating apparatus according to claim 1, wherein
    the controller determines as the lowered position a position where a gap between a top face of the substrate and a lower face of the movable top board is 10 mm.

* * * * *